US011631366B2

(12) United States Patent
Ozaki

(10) Patent No.: US 11,631,366 B2
(45) Date of Patent: Apr. 18, 2023

(54) DISPLAY DEVICE

(71) Applicant: Japan Display Inc., Tokyo (JP)

(72) Inventor: Tadafumi Ozaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/560,398

(22) Filed: Dec. 23, 2021

(65) Prior Publication Data

US 2022/0114954 A1 Apr. 14, 2022

Related U.S. Application Data

(63) Continuation of application No. PCT/JP2020/015576, filed on Apr. 6, 2020.

(30) Foreign Application Priority Data

Jul. 5, 2019 (JP) .............................. JP2019-126090

(51) Int. Cl.
 *G09G 3/32* (2016.01)
(52) U.S. Cl.
 CPC ....... *G09G 3/32* (2013.01); *G09G 2300/0842* (2013.01); *G09G 2310/08* (2013.01); *G09G 2330/02* (2013.01)
(58) Field of Classification Search
 CPC ............. G09G 3/32; G09G 2300/0842; G09G 2310/08; G09G 2330/02; G09G 2300/0426; G09G 2300/0819; G09G 2330/028; G09G 3/3275; G09G 3/3233; H01L 33/00
 See application file for complete search history.

(56) References Cited

U.S. PATENT DOCUMENTS

| 2007/0052641 | A1 | 3/2007 | Hagino et al. |
| 2011/0122173 | A1 | 5/2011 | Sehata et al. |
| 2015/0022561 | A1* | 1/2015 | Ikeda ...................... G09F 9/301 345/77 |
| 2016/0086537 | A1* | 3/2016 | Shin ..................... G09G 3/3225 345/207 |
| 2017/0337885 | A1* | 11/2017 | Aoki .................... G09G 3/3426 |

(Continued)

FOREIGN PATENT DOCUMENTS

| JP | 2004-212668 A | 7/2004 |
| JP | 2008-164721 A | 7/2008 |

(Continued)

OTHER PUBLICATIONS

International Search Report dated Jun. 23, 2020 in PCT/JP2020/015576, filed on Apr. 6, 2020, 2 pages.

*Primary Examiner* — Andrew Sasinowski
(74) *Attorney, Agent, or Firm* — Maier & Maier, PLLC

(57) ABSTRACT

According to one embodiment, a display device includes pixels, gate lines, source lines, a first driver, and a second driver selecting a gradation voltage corresponding to a gradation value of input image data from either of a plurality of gradation voltages of a first system and gradation voltages of a second system, and supplying the selected gradation voltage to the corresponding source line of the plurality of source lines. In at least a gradation region of all gradation regions of the image data, a value of the corresponding gradation voltage of the second system is relatively different from a value of the corresponding gradation voltage of the first system, for each of same gradation values.

12 Claims, 7 Drawing Sheets

(56) References Cited

U.S. PATENT DOCUMENTS

| | | | |
|---|---|---|---|
| 2018/0005566 A1* | 1/2018 | Kurokawa | G09G 3/3208 |
| 2018/0019233 A1 | 1/2018 | Chang et al. | |
| 2018/0182279 A1 | 6/2018 | Sakariya et al. | |
| 2021/0028270 A1* | 1/2021 | Yokoyama | H05B 33/06 |

FOREIGN PATENT DOCUMENTS

| | | | |
|---|---|---|---|
| JP | 2011-112728 A | 6/2011 | |
| JP | 2018-14475 A | 1/2018 | |
| JP | 2018-519539 A | 7/2018 | |

* cited by examiner

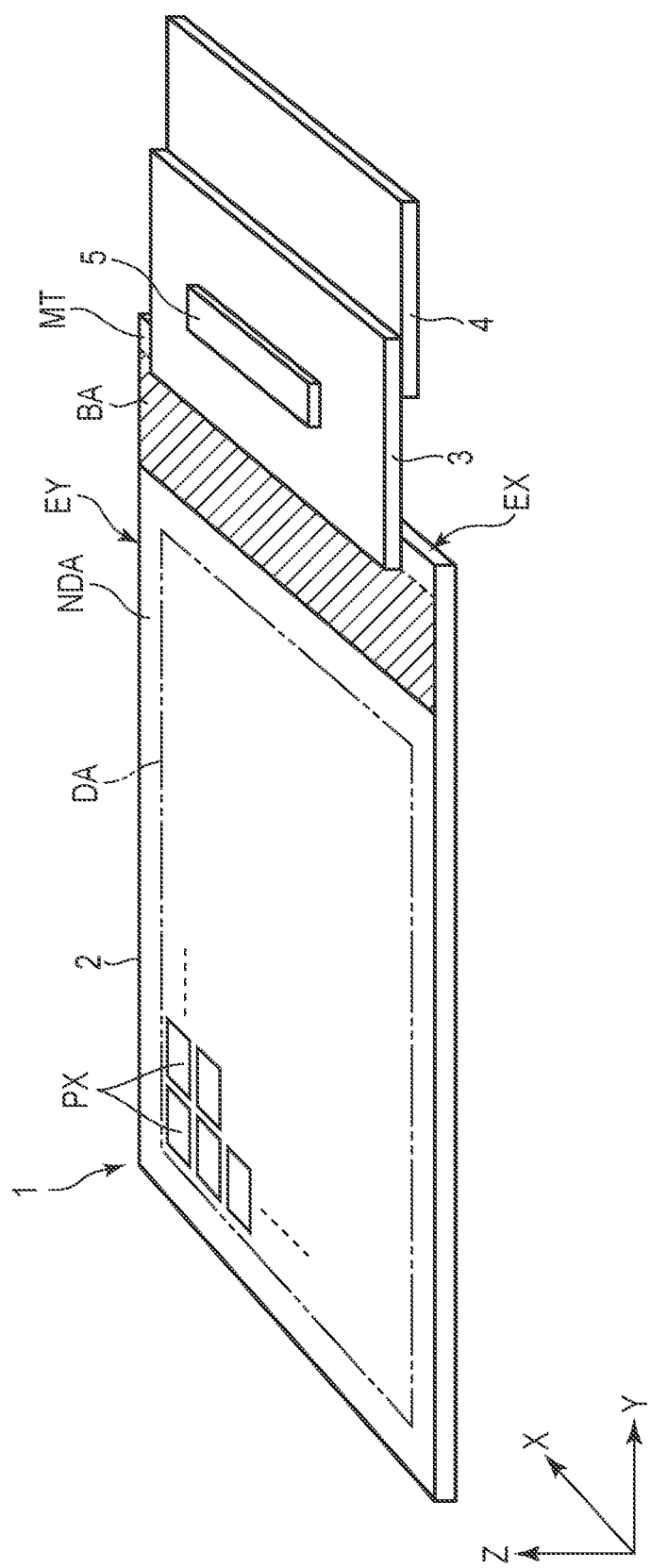
F I G. 1

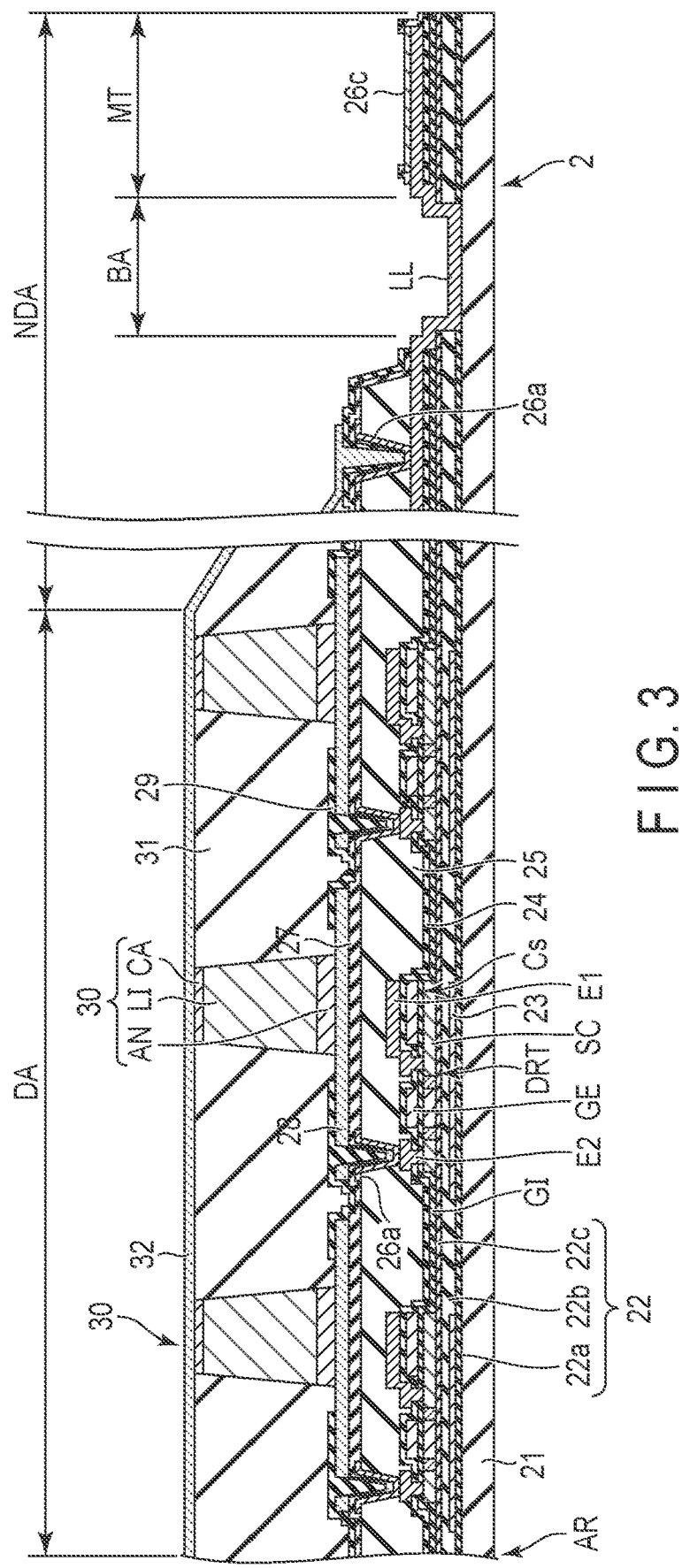
F I G. 3

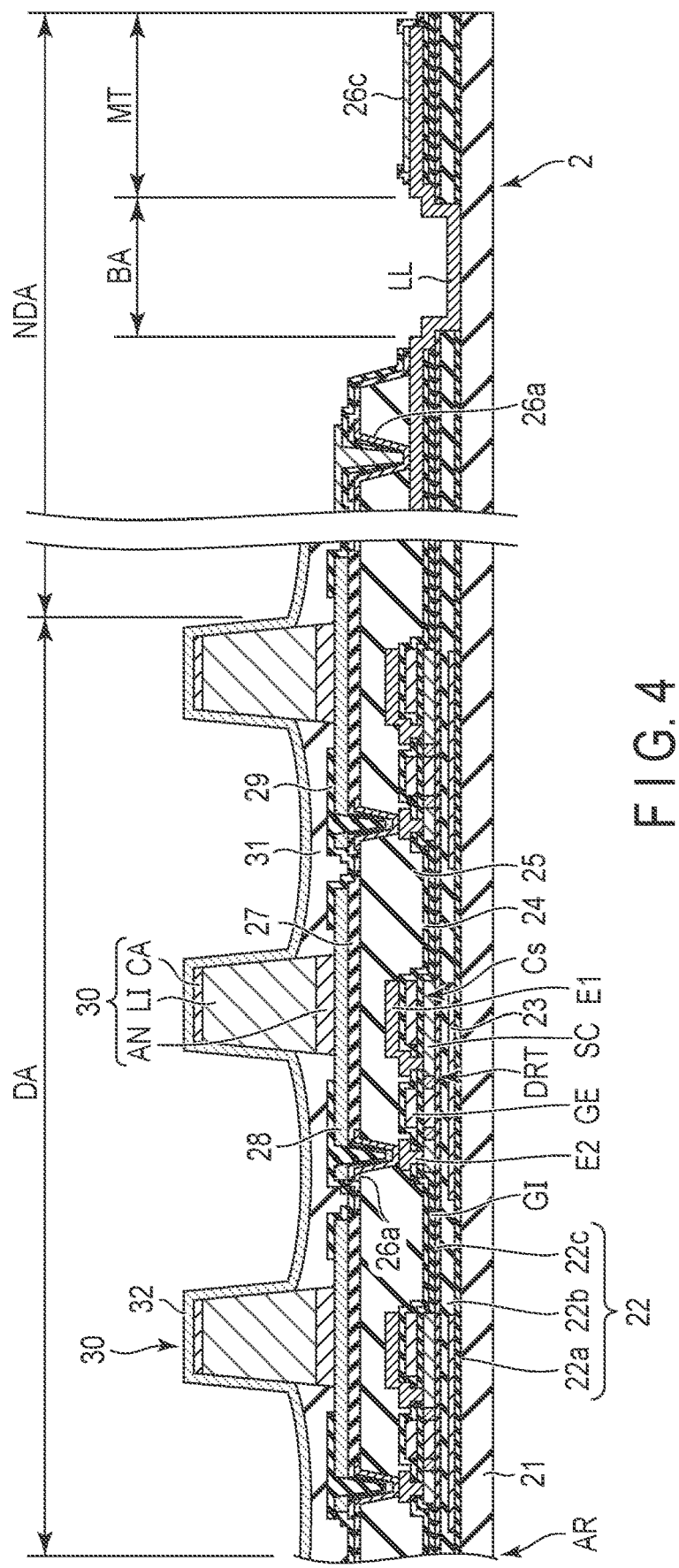
F I G. 4

DISPLAY DEVICE

CROSS-REFERENCE TO RELATED APPLICATIONS

This application is a Continuation Application of PCT Application No. PCT/JP2020/015576, filed Apr. 6, 2020 and based upon and claiming the benefit of priority from Japanese Patent Application No. 2019-126090, filed Jul. 5, 2019, the entire contents of all of which are incorporated herein by reference.

FIELD

Embodiments described herein relate generally to a display device.

BACKGROUND

LED display devices using light emitting diodes (LED) that are self-luminous light emitting elements are known as display devices. Recently, a display device (hereinafter referred to as a micro LED display device) in which minute light emitting diodes referred to as micro LEDs are mounted on an array substrate has been developed as a higher definition display device.

Since the micro LED display device is formed such that a large number of chip-like micro LEDs are mounted in the display region, unlike conventional liquid crystal display devices and organic electroluminescent (EL) display devices, both higher definition and larger scale of the display device can easily be achieved and the display device is focused as a next generation display device.

BRIEF DESCRIPTION OF THE DRAWINGS

FIG. 1 is a perspective view showing a configuration of a display device according to a first embodiment.

FIG. 3 is a cross-sectional view showing the display device.

FIG. 4 is a cross-sectional view showing a modified example of the display device.

DETAILED DESCRIPTION

Figure 2:
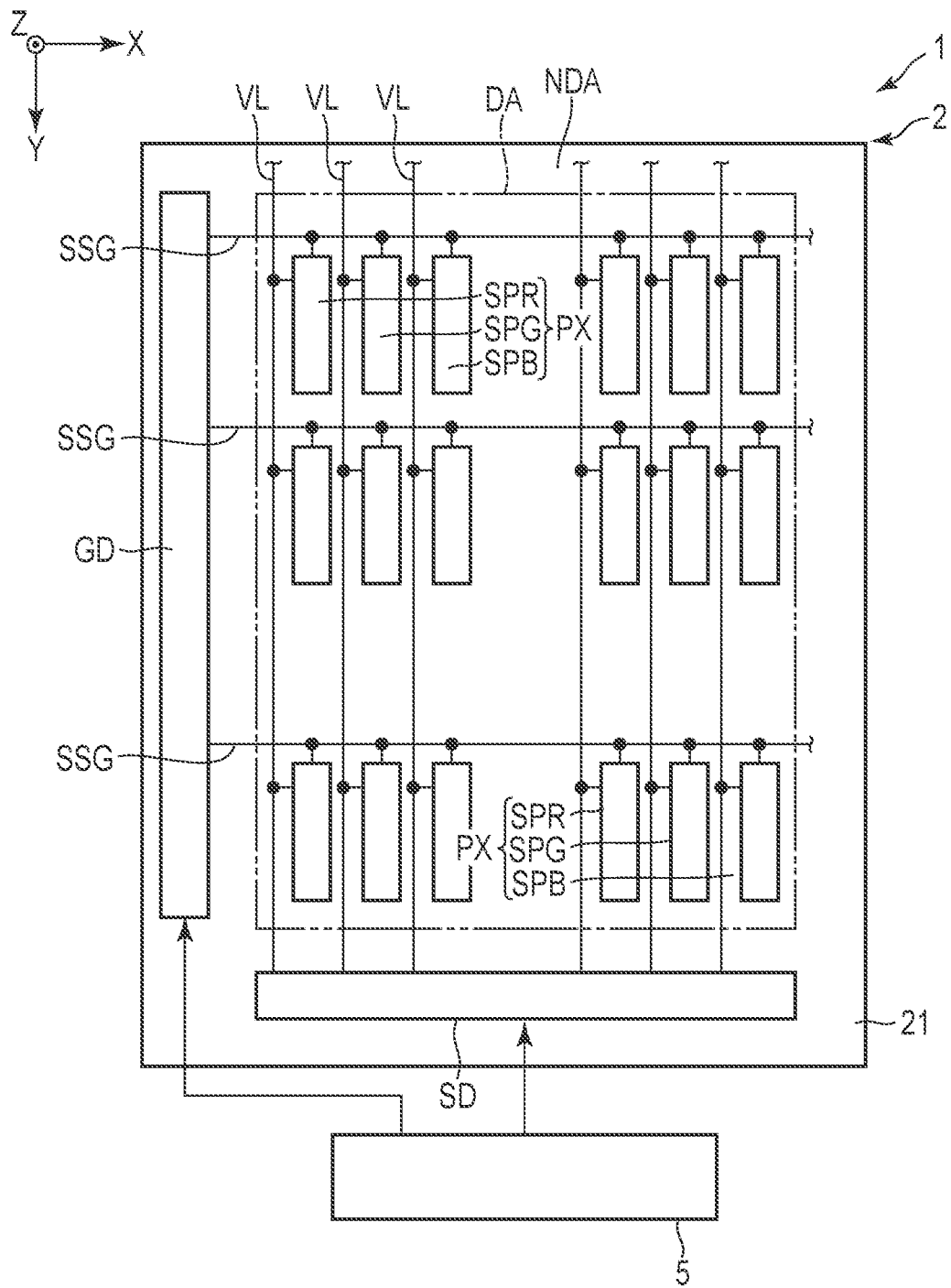
FIG. 2 is a plan view showing a circuit configuration of the display device.

In general, according to one embodiment, there is provided a display device comprising: a plurality of pixels arranged in a row direction and a columnar direction; a plurality of gate lines, each of the gate lines being shared by the plurality of pixels arranged in the row direction; a plurality of source lines, each of the source lines being shared by the plurality of pixels arranged in the columnar direction; a first driver supplying control signals to the plurality of gate lines; and a second driver selecting a gradation voltage corresponding to a gradation value of input image data from either of a plurality of gradation voltages of a first system and gradation voltages of a second system, and supplying the selected gradation voltage to the corresponding source line of the plurality of source lines. In at least a gradation region of all gradation regions of the image data, a value of the corresponding gradation voltage of the second system is relatively different from a value of the corresponding gradation voltage of the first system, for each of same gradation values.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

First, a first embodiment will be described, and FIG. 1 is a perspective view showing a configuration of a display device 1 according to the present embodiment. FIG. 1 shows a three-dimensional space that is defined by a first direction X, a second direction Y perpendicular to the first direction X, and a third direction Z perpendicular to the first direction X and the second direction Y. The first direction X and the second direction Y are orthogonal to each other, but may intersect at an angle other than 90 degrees. In addition, in the present embodiment, the third direction Z is defined as an upper or upward direction while a direction opposite to the third direction Z is defined as a lower or downward direction. According to "a second member above/on a first member" and "a second member below/under a first member", the second member may be in contact with the first member or may be remote from the first member.

In the present embodiment, an example in which the display device 1 is a micro LED display device using a micro light emitting diode [hereinafter referred to as a micro light emitting diode (micro LED), which is a self-luminous light emitting element] will be mainly described below.

As shown in FIG. 1, the display device 1 comprises a display panel 2, a first circuit substrate 3, a second circuit substrate 4, and the like.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 includes a display region DA and a non-display region NDA located outside the display region DA. The non-display region NDA includes a terminal region MT. In the example illustrated, the non-display region NDA surrounds the display region DA.

The display region DA is a region where an image is displayed, and includes a plurality of main pixels PX arrayed in a matrix in the first direction X and the second direction Y. In the present embodiment, the first direction X is a row direction and the second direction Y is a column direction.

The terminal region MT is provided along the shorter sides EX of the display panel 2 and includes a terminal which electrically connects the display panel 2 with an external device or the like.

The first circuit substrate 3 is mounted on the terminal region MT and is electrically connected to the display panel 2. The first circuit substrate 3 is, for example, a flexible printed circuit. The first circuit substrate 3 comprises a driver IC chip (hereinafter referred to as a panel driver) 5 which drives the display panel 2, and the like. In the example illustrated, the panel driver 5 is arranged on the first circuit substrate 3, but may be arranged under the first circuit substrate 3. Alternatively, the panel driver 5 may be mounted on a part other than the first circuit substrate 3, for example, the second circuit substrate 4. The second circuit substrate 4 is, for example, a flexible printed circuit. The second circuit substrate 4 is connected to the first circuit substrate 3, for example, at a position under the first circuit substrate 3.

The above panel driver 5 is connected to a control board (not shown) via, for example, the second circuit substrate 4. For example, the panel driver 5 executes control of displaying an image on the display panel 2 by driving the main pixels PX, based on image data (for example, video data) output from the control board.

The display panel 2 may include a fold region BA represented by hatch lines. The fold region BA is a region which is folded when the display device 1 is accommodated in a housing of the electronic apparatus or the like. The fold region BA is located on the terminal region MT side of the non-display region NDA. In a state in which the fold region BA is folded, the first circuit substrate 3 and the second circuit substrate 4 are arranged under the display panel 2 so as to be opposed to the display panel 2.

FIG. 2 is a plan view showing a circuit configuration of the display device 1.

As shown in FIG. 2, the display device 1 comprises an active matrix display panel 2. The display panel 2 includes an insulating substrate 21, the main pixels PX arranged on the insulating substrate 21, various lines, a gate driver GD, and a source driver SD. In the present embodiment, the gate driver GD functions as a first driver and the source driver SD functions as a second driver.

Each of the main pixels PX includes pixels SP of a plurality of colors. In the present embodiment, the main pixel PX includes three types of pixels, i.e., a first pixel SPR exhibiting a first color, a second pixel SPG exhibiting a second color, and a third pixel SPB exhibiting a third color. In this example, the first color is red, the second color is green, and the third color is blue. A plurality of pixels SP are arranged in a matrix in the first direction X and the second direction Y in the display region DA.

The pixel SP includes a light emitting element (micro LED) and a pixel circuit for supplying a drive current to the light emitting element to drive the light emitting element. The pixel circuit includes a drive transistor, various types of switching elements, and the like, which will be described later. In the present embodiment, the terms such as the main pixels PX and the pixels SP have been described, but the main pixels PX can be restated to pixels. In this case, the pixels SP are sub-pixels.

The various types of lines extend in the display region DA and are drawn to the non-display region NDA. In FIG. 2, a plurality of gate lines SSG and a plurality of source lines VL are exemplified as some of various types of lines. Each of the gate lines SSG is shared by the pixels SP arranged in the first direction X. Each of the source lines VL is shared by the pixels SP arranged in the second direction Y.

The gate driver GD and the source driver SD are located in the non-display region NDA. In the display region DA, the gate lines SSG and the source lines VL are connected to the pixels SP. The gate lines SSG are connected to the gate driver GD in the non-display region NDA. The source lines VL are connected to the source driver SD in the non-display region NDA.

Various types of signals and voltages are given to the gate driver GD and the source driver SD from the panel driver 5.

FIG. 3 is a cross-sectional view showing the display device 1. An example in which a fine light emitting diode referred to as the micro LED is mounted on the pixel electrode as a light emitting element will be described. The display region DA and the non-display region NDA are mainly shown in FIG. 3. The non-display region NDA includes the fold region BA which can be folded and the terminal region MT.

As shown in FIG. 3, an array substrate AR of the display panel 2 comprises the insulating substrate 21. A glass substrate of quartz, alkali-free glass, etc., or a resin substrate of polyimide, etc., can be mainly used as the insulating substrate 21. The material of the insulating substrate 21 may be a material withstanding a processing temperature in manufacturing of a thin film transistor (TFT). When the insulating substrate 21 is a flexible resin substrate, the display device 1 can be composed of a sheet display. For the resin substrate, the resin material is not limited to polyimide but may be the other material. When polyimide or the like is used to form the insulating substrate 21, the insulating substrate 21 may be referred to as an organic insulating layer or a resin layer, more appropriately.

An undercoat layer 22 of a three-layer stacked structure is provided on the insulating substrate 21. The undercoat layer 22 includes a first layer 22a formed of a silicon oxide ($SiO_2$), a second layer 22b formed of a silicon nitride (SiN), and a third layer 22c formed of a silicon oxide ($SiO_2$). The first layer 22a of the lowermost layer is provided to improve adhesion with the insulating substrate 21, which is a basement, the second layer 22b of the middle layer is provided as a blocking film for moisture and impurities from the outside, and the third layer 22c of the uppermost layer is provided as a blocking layer which prevents hydrogen atoms contained in the second layer 22b from diffusing to the semiconductor layer SC side to be described later. The undercoat layer 22 is not limited to this structure. The undercoat layer 22 may further include stacked layers or may have a single-layer structure or a two-layer structure. For example, when the insulating substrate 21 is formed of a glass, a silicon nitride film may be formed directly on the insulating substrate 21 since the silicon nitride film has a comparatively good adherence.

A light-shielding layer 23 is arranged on the insulating substrate 21. The position of the light-shielding layer 23 is made to correspond to a location where a TFT is to be formed later. In the present embodiment, the light-shielding layer 23 is formed of a metal. However, the light-shielding layer 23 may be formed of a material having a light-shielding property such as a black layer. In addition, in the present embodiment, the light-shielding layer 23 is provided on the first layer 22a and is covered with the second layer 22b. The light-shielding layer 23 may be provided on the insulating substrate 21 and covered with the first layer 22a, unlike the present embodiment. According to the light-shielding layer 23, since entry of light to a back surface of the channel layer of the TFT can be suppressed, variation in the TFT properties resulting from the light which can be made incident from the insulating substrate 21 side can be suppressed. In addition, when the light-shielding layer 23 is formed of a conductive layer, a backdate effect can be assigned to the TFT by supplying a predetermined potential to the light-shielding layer 23.

A thin film transistor (TFT) such as a drive transistor DRT is formed on the undercoat layer 22. A polysilicon TFT using polycrystalline silicon for the semiconductor layer SC is used as an example of the TFT. In the present embodiment, the semiconductor layer SC is formed by using low-temperature polycrystalline silicon. In this example, the drive transistor DRT is a P-channel TFT (Pch TFT). The semiconductor layer SC of the Pch TFT includes a first region, a second region, a channel region between the first region and the second region, and low-concentration impurity regions that are provided between the channel region and the first region and between the channel region and the second region, respectively. One of the first region and the second region functions as a source region, and the other of the first region and the second region functions as a drain region. The array substrate AR may include not only the Pch TFT, but an N-channel TFT (Nch TFT). In this case, the Nch TFT and the Pch TFT may be formed simultaneously. In addition, the semiconductor layer SC may be formed by using a semiconductor other than polycrystalline silicon, such as amorphous silicon or an oxide semiconductor.

A gate insulating film GI is formed by using a silicon oxide film, and a gate electrode GE is formed of molybdenum tungsten (MoW). A line or electrode formed on the gate insulating film GI, such as the gate electrode GE, is often referred to as a 1st line or a 1st metal. The gate electrode GE comprises a function of a storage capacitance electrode to be described later in addition to a function of the gate electrode of the TFT. The example of the top-gate TFT has been described, but the TFT may be a bottom-gate TFT.

An interlayer insulating film 24 is provided on the gate insulating film GI and the gate electrode GE. The interlayer insulating film 24 is configured by sequentially stacking, for example, a silicon nitride film and a silicon oxide film on the gate insulating film GI and the gate electrode GE. The gate insulating film GI and the interlayer insulating film 24 are not provided in the fold region BA. For this reason, after forming the gate insulating film GI and the interlayer insulating film 24 on the entire region on the insulating substrate 21 including the fold region BA, patterning is executed on the gate insulating film GI and the interlayer insulating film 24 to remove at least a part of the gate insulating film GI and the interlayer insulating film 24 that corresponds to the fold region BA. Furthermore, since the undercoat layer 22 is exposed by removing the interlayer insulating film 24 or the like, the undercoat layer 22 is also patterned such that a part corresponding to the fold region BA is removed. After the undercoat layer 22 is removed, for example, polyimide constituting the insulating substrate 21 is exposed. Film reduction that an upper surface of the insulating substrate 21 is partially eroded may occur due to etching of the undercoat layer 22.

In this case, a wiring pattern (not shown) may be formed under each of a step part at an end portion of the interlayer insulating film 24 and a step part at an end portion of the undercoat layer 22. According to this, when a routing line LL is formed across the step part, the routing line LL passes on the wiring pattern. Since the gate insulating film GI is provided between the interlayer insulating film 24 and the undercoat layer 22 and since, for example, a light-shielding layer 23 is provided between the undercoat layer 22 and the insulating substrate 21, the wiring pattern can be formed using those layers.

A first electrode E1, a second electrode E2, and the routing line LL are provided on the interlayer insulating film 24. Each of the first electrode E1, the second electrode E2, and the routing line LL adopts a three-layer stacked structure (Ti-based/Al-based/Ti-based), and includes a lower layer formed of metal materials containing titanium (Ti) as a main component, such as Ti and an alloy containing Ti, a middle layer formed of metal materials containing aluminum (Al) as a main component, such as Al and an alloy containing Al, and an upper layer formed of metal materials containing Ti as a main component, such as Ti and an alloy containing Ti. Lines and electrodes formed on the interlayer insulating film 24, such as the first electrode E1, are often referred to as 2nd lines or 2nd metals.

The first electrode E1 is connected to the first region of the semiconductor layer SC, and the second electrode E2 is connected to the second region of the semiconductor layer SC. For example, when the first region of the semiconductor layer SC functions as the source region, the first electrode E1 is the source electrode, and the second electrode E2 is the drain electrode. The first electrode E1 forms a storage capacitor Cs together with the interlayer insulating film 24 and a gate electrode (storage capacitance electrode) GE of the TFT. The routing line LL is made to extend to a peripheral end of the insulating substrate 21 to form a terminal making connection between the first circuit substrate 3 and the panel driver (driver IC) 5.

Since the routing line LL is formed to reach the terminal part across the fold region BA, the routing line LL crosses the steps of the interlayer insulating film 24 and the undercoat layer 22. Since the wiring pattern of the light-shielding layer 23 is formed at the step part as described above, conduction can be maintained by making a contact with the lower wiring pattern even if the routing line LL is broken at a recess of the step.

A planarizing film 25 is formed on the interlayer insulating film 24, the first electrode E1, the second electrode E2, and the routing line LL to cover the TFT and the routing line LL. An organic insulating material such as a photosensitive acrylic is frequently used as the planarizing film 25. The planarizing film 25 is excellent in coverage of the wiring step and the planarization of surface as compared with an inorganic insulating material formed by chemical-vapor deposition (CVD), and the like.

The planarizing film 25 is removed in the pixel contact part and the peripheral region. A conductive layer 26 is provided on the planarizing film 25. The conductive layer 26 is formed of, for example, indium tin oxide (ITO) as an oxide conductive layer. The conductive layer 26 includes, for example, a conductive layer 26a covering the part where the first electrode E1 and the routing line LL are exposed by removal of the planarizing film 25. One of the objects of providing the conductive layer 26a is to serve as a barrier film to prevent the exposed part of the first electrode E1 or the routing line LL from being damaged in the manufacturing process. The planarizing film 25 and the conductive layer 26 are covered with an insulating layer 27. For example, the insulating layer 27 is formed of a silicon nitride film.

A pixel electrode 28 is formed on the insulating layer 27. The pixel electrode 28 is in contact with the conductive layer 26a through an opening of the insulating layer 27 and is electrically connected to the first electrode E1. In this example, the pixel electrode 28 is a connection terminal to mount a light emitting element 30. The pixel electrode 28 is formed of a stacked layer body including a single conductive layer or two or more conductive layers. In the present embodiment, the pixel electrode 28 adopts a two-layer stacked structure (Al-based/Mo-based) and includes a lower layer formed of metal materials containing Mo as a main component, such as Mo and an alloy containing Mo, and an upper layer formed of metal materials containing Al as a main component, such as Al and an alloy containing Al. The conductive layer 26 includes a conductive layer 26c forming the surface of the terminal part.

An insulating layer 29 is provided on the insulating layer 27 and the pixel electrode 28. The insulating layer 29 is formed of, for example, a silicon nitride. The insulating layer 29 includes an opening which insulates the end part of the pixel electrode 28 and the like and which mounts a light emitting element (micro LED) 30 on a part of the surface of the pixel electrode 28. The size of the opening of the insulating layer 29 is set to be larger than a light emitting element 30 in consideration of the mount displacement amount in a process of mounting the light emitting element 30, and the like. For example, when the light emitting element 30 substantially has a mount area of 10 μm×10 μm, the opening is desirably secured to be approximately 20 μm×20 μm.

In the display region DA, the light emitting elements 30 are mounted on the array substrate AR. The light emitting element 30 includes an anode AN serving as a first electrode, a cathode CA serving as a second electrode, and an emitting layer LI that emits light. The light emitting elements 30 having emission colors of R, G, and B are prepared respectively, and their anode side terminals are in contact with the corresponding pixel electrodes 28 so as to be fixed. Joint between the anode AN of the light emitting element 30 and the pixel electrode 28 is not particularly limited if desirable conduction can be secured between them and does not break the formed object of the array substrate AR. For example, a reflow process using a soldering material molten at a low temperature, a method such as placing the light emitting elements 30 on the array substrate AR via a conductive paste and then sintering the light emitting elements 30, or a method of solid-state welding such as ultrasonic welding with the surface of the pixel electrode 28 and the anode AN of the light emitting element formed of the materials of the same base, can be adopted.

The light emitting element 30 comprises the cathode CA on a side opposite to the anode AN electrically connected to the pixel electrode 28. The light emitting elements 30 are mounted and then an element insulating layer 31 is provided on the pixel electrode 28 and the insulating layer 29. The element insulating layer 31 is formed of a resin material with which a gap part between the light emitting elements 30 is filled, on the insulating layer 29. The element insulating layer 31 exposes the surfaces of the cathodes CA, of the light emitting elements 30.

A counter-electrode 32 is located in at least the display region DA to cover the light emitting elements 30 of all the pixels. The counter-electrode 32 is arranged on the surfaces of all the cathodes CA in the counter-electrode 32 side, and on the element insulating layer 31, and is in contact with all the cathodes CA and is electrically connected to all the cathodes CA. The counter-electrode 32 is shared by all the pixels. The counter-electrode 32 is connected to a line (i.e., a second power line 42 to be described later) provided on the array substrate AR side at a cathode contact portion provided outside the display region DA. For this reason, the counter-electrode 32 is stored at the same constant potential as the electric potential of the second power line 42 and makes electric connection between the second power line 42 and the cathodes CA of all the light emitting elements 30.

The counter-electrode 32 needs to be formed as a transparent electrode to take emitted light from the light emitting elements 30 and is formed by using, for example, ITO as the transparent conductive material. The conductive layer 26 formed of ITO is often referred to as 1st ITO, and the counter-electrode 32 formed of ITO is often referred to as 2nd ITO.

In contrast, when side wall parts of the light emitting elements 30 are insulated by a protective film or the like, the gap does not need to be filled with a resin material or the like and the resin material needs only to insulate at least the anodes AN and the surface of the pixel electrode 28 exposed from the anodes AN. In this case, as shown in FIG. 4, the element insulating layer 31 is formed with a thickness which does not reach the cathodes CA of the light emitting elements 30 and then the above-mentioned counter-electrode 32 is formed. Uneven parts caused by the mounting of the light emitting elements 30 partially remain on the surface on which the counter-electrode 32 is formed, but the material forming the counter-electrode 32 may sequentially cover the light emitting elements 30 without a break.

As described above, the array substrate AR has a structure extending from the insulating substrate 21 to the counter-electrode 32. For example, the display device 1 using the light emitting elements 30 according to the present embodiment as the display elements is constituted as described above. A cover member such as a cover glass, a touch panel board or the like may be provided on the counter-electrode 32 as needed. The cover member or the touch panel board may be provided via a filler using resin or the like to fill the gap between the cover member (or the touch panel board) and the display device 1.

Figure 5:
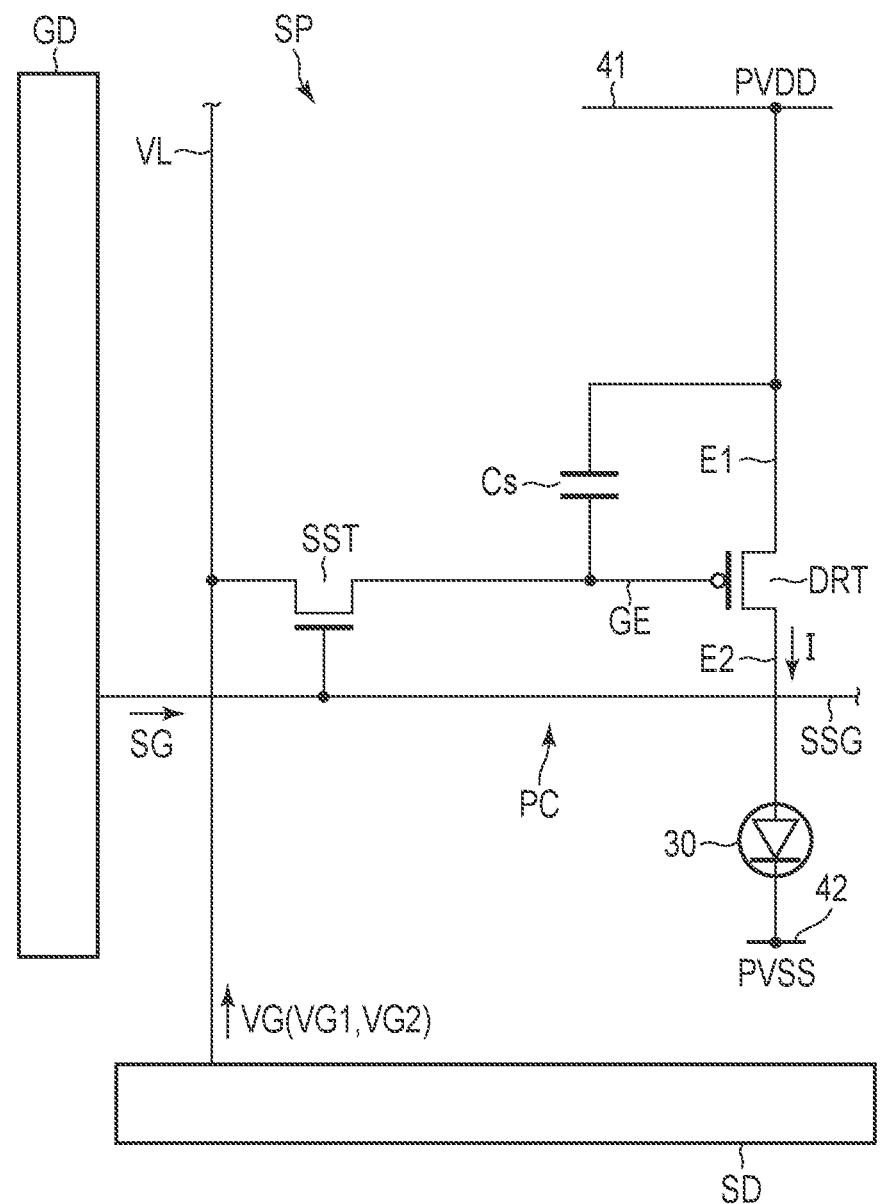
FIG. 5 is a circuit diagram illustrating an example of a configuration of the display device.

Next, a circuit configuration of the display device 1 will be described with reference to FIG. 5. FIG. 5 is a circuit diagram illustrating an example of the configuration of the display device 1. The pixels SP mentioned above are configured in the same manner. Thus, one representative pixel SP of the pixels SP will be described with reference to FIG. 5.

As shown in FIG. 5, the gate driver GD is configured to supply control signals SG to a plurality of gate lines SSG. The pixel SP includes the light emitting element 30 and a pixel circuit PC which supplies a drive current to the light emitting element 30. The pixel circuit PC is electrically connected to the pixel electrode 28 shown in FIG. 3. The pixel circuit PC includes a drive transistor DRT, a pixel switch SST, and a storage capacitor Cs as a plurality of elements. In FIG. 5, the drive transistor DRT is a Pch TFT while the pixel switch SST is an Nch TFT.

The pixel switch SST may not be composed of a transistor. The pixel switch SST needs only to function as a switch which is switched on or off.

In the following descriptions, one of the source electrode and the drain electrode of the transistor is referred to as a first electrode and the other is referred to as a second electrode. In addition, one of electrodes of the capacitive element is referred to as a first electrode and the other is referred to as a second electrode.

The drive transistor DRT, the pixel electrode 28 (FIG. 3), and the light emitting element 30 are serially connected between a first power line 41 and the second power line 42. The first power line 41 is stored at a constant potential, and the second power line 42 is stored at a constant potential different from the electric potential of the first power line 41.

In the present embodiment, the electric potential PVDD of the first power line 41 is higher than the electric potential PVSS of the second power line 42.

The drive transistor DRT includes a first electrode E1 connected to the first power line 41, a second electrode E2 connected to the light emitting element 30 (anode AN of FIG. 3), and a gate electrode GE. The drive transistor DRT is configured to control a current value to the light emitting element 30.

The light emitting element 30 is connected between the second electrode E2 of the drive transistor DRT, and the second power line 42.

The pixel switch SST is connected between the corresponding source line VL, of the source lines VL, and the gate electrode GE of the drive transistor DRT. A gate electrode of the pixel switch SST is connected to the corresponding gate line SSG, of the gate lines SSG. The pixel switch SST is switched on or off in accordance with the control signal SG supplied via the corresponding gate line SSG. In the present embodiment, the pixel switch SST is maintained in the off state by a low (L) level control signal SG and is switched on by a high (H) level control signal SG.

The storage capacitor Cs is connected to the gate electrode GE of the drive transistor DRT. In the present embodiment, the storage capacitor Cs is connected between the gate electrode GE and the first electrode (source electrode) E1 of the drive transistor DRT.

A gradation voltage (image signal) VG is written from the source line VL to the gate electrode GE via the pixel switch SST, and the gradation voltage VG is stored in the storage capacitor Cs, by switching the pixel switch SST to the on state. The amount of the current flowing to the drive transistor DRT is thereby regulated.

The drive transistor DRT may be an Nch TFT and, in this case, the storage capacitor Cs may be connected between the gate electrode GE and the second electrode (source electrode) E2 of the drive transistor DRT.

Alternatively, when the drive transistor DRT is an Nch TFT, the drive transistor may be configured such that a current flows to the light emitting element 30 in a direction opposite to that of the present embodiment.

The circuit configuration described with reference to FIG. 5 is a mere example, and the circuit configuration of the display device 1 may be the other if the circuit configuration includes the drive transistor DRT, the pixel switch SST and the storage capacitor Cs. For example, the other constituent elements may be added to the circuit configuration described with reference to FIG. 5.

Figure 6:
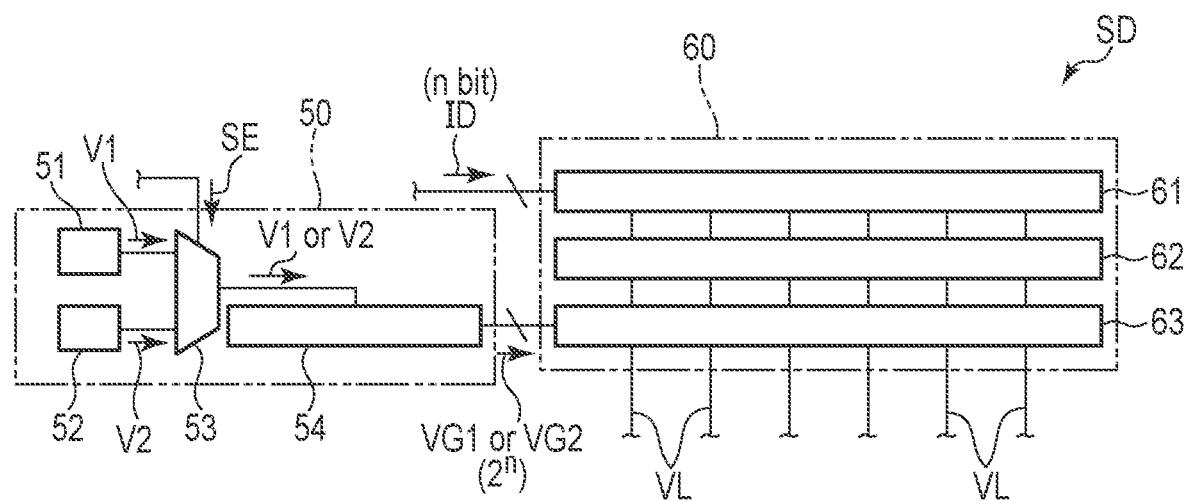
FIG. 6 is a circuit diagram showing a configuration of a source driver of the display device.

Next, a configuration of the source driver SD according to the present embodiment will be described. FIG. 6 is a circuit diagram showing the configuration of the source driver SD of the display device 1.

As shown in FIG. 6, the source driver SD comprises a control circuit 50 and a driving circuit 60. The control circuit 50 includes a first gradation power supply 51, a second gradation power supply 52, a select circuit 53, and a gradation voltage generation circuit 54. The first gradation power supply 51 is configured to output a first reference voltage V1. The second gradation power supply 52 is configured to output a second reference voltage V2 different from the first reference voltage V1.

The select circuit 53 is composed of a multiplexer. The first reference voltage V1 is input from the first gradation power supply 51, the second reference voltage V2 is input from the second gradation power supply 52, and a select signal (gradation voltage select signal) SE is further input, to the select circuit 53. The select circuit 53 is configured to output the first reference voltage V1 or the second reference voltage V2, based on the select signal SE. In the present embodiment, a value of the second reference voltage V2 is relatively lower than a value of the first reference voltage V1.

The gradation voltage generation circuit 54 is composed of a voltage divider in which a plurality of resistors are connected in series. The first reference voltage V1 or the second reference voltage V2 is input from the select circuit 53 to the gradation voltage generation circuit 54. The gradation voltage generation circuit 54 is configured to generate the gradation voltages VG1 of a first system, based on the first reference voltage V1 input from the select circuit 53, or to generate the gradation voltages VG2 of a second system, based on the second reference voltage V2 input from the select circuit 53.

The control circuit 50 includes a single gradation voltage generation circuit 54. For this reason, miniaturization of the control circuit 50 can be attempted as compared with a case where the control circuit 50 include the gradation voltage generation circuits 54.

As described above, the control circuit 50 is configured to output the gradation voltages VG1 of the first system or the gradation voltages VG2 of the second system. The gradation voltages VG1 and VG2 of the respective first system and second system are analog signals of $2^n$ gradation. In the above case, n is a natural number. In the present embodiment, n=8, and the gradation voltages VG1 and VG2 are analog signals of 256 gradation.

The driving circuit 60 includes a sequential circuit 61, a line memory 62, and a data conversion unit 63.

The sequential circuit 61 is composed of a plurality of shift registers connected in series. Image data ID is input to the sequential circuit 61. In this case, the image data ID is an n-bit digital signal. In the present embodiment, since n=8, the image data ID is an 8-bit digital signal. The image data ID input from the sequential circuit 61 is sequentially output from the shift registers to the line memory 62.

The line memory 62 is composed of a plurality of latch circuits. The line memory 62 is configured to store the image data ID for one line (one row or one horizontal scanning period) input to the sequential circuit 61.

The data conversion unit 63 is composed of a digital to analog converter (D-A converter). The image data ID is input from the line memory 62, and the gradation voltages VG1 or VG2 of the first system or the second system are input from the control circuit 50, to the data conversion unit 63. The data conversion unit 63 is configured to select the gradation voltage corresponding to the gradation value of the image data ID from the gradation voltages VG1 (or the gradation voltages VG2) of the input system and to supply the selected gradation voltage to the corresponding source line VL.

Based on the above, the drive circuit 60 is configured to receive the input of the image data ID, to further receive the input of the gradation voltages VG1 or VG2 of the first system or the second system from the control circuit 50, to select the gradation voltage corresponding to the gradation value of the image data ID from the gradation voltages VG1 (or the gradation voltages VG2) of the input system, and to supply the selected gradation voltage to the corresponding source line VL.

Then, the source driver SD is configured to select the gradation voltage corresponding to the gradation value of the input image data ID from either of the gradation voltages VG1 of the first system and the gradation voltages VG2 of the second system and to supply the selected gradation voltage to the corresponding source line VL of the source lines VL.

In at least a gradation region of all the gradation regions of the image data ID, the value of the corresponding gradation voltage VG2 of the second system is relatively different from the value of the corresponding gradation voltage VG1 of the first system, for each of the same gradation values.

In the present embodiment, in all the gradation regions of the image data ID, the value of the corresponding gradation voltage VG2 of the second system is relatively different from the value of the corresponding gradation voltage VG1 of the first system, at each of the same gradation. More specifically, in all the gradation regions of the image data ID, the value of the corresponding gradation voltage VG2 of the second system is relatively lower than the value of the corresponding gradation voltage VG1 of the first system, at each of the same gradation. For example, the value of the gradation voltage VG1 is a standard value, and the value of the gradation voltage VG2 is a value lower than the standard.

Figure 7:
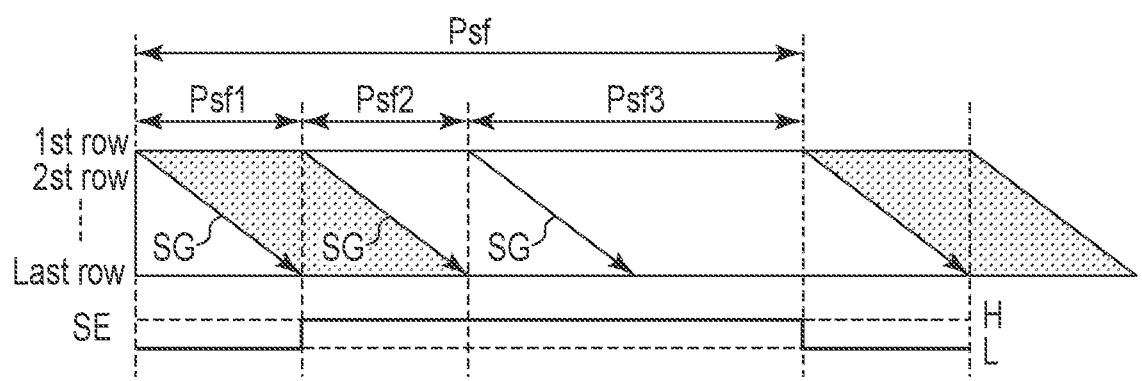
FIG. 7 is a timing chart showing an example of a display operation of the display device.

Next, a display operation of the display device 1 will be described. FIG. 7 is a timing chart showing an example of the display operation of the display device 1. In the chart, a dot pattern is assigned to a period in which the light emitting element 30 emits light using the gradation voltage VG2 of the second system.

As shown in FIG. 7 as well as FIG. 5 and FIG. 6, a frame period Pf includes a plurality of sub-frame periods Psf. In the present embodiment, the frame period Pf includes three sub-frame periods, i.e., a sub-frame period Psf1, a sub-frame period Psf2, and a sub-frame period Psf3. However, the frame period Pf may include two sub-frame periods Psf or four or more sub-frame periods Psf.

The sub-frame periods Psf of the frame period Pf have any one of two or more time periods. In the present embodiment, the sub-frame period Psf1 and the sub-frame period Psf2 have the same time periods, and the sub-frame period Psf3 has a time period which is twice as long as the time period of each of the sub-frame period Psf1 and the sub-frame period Psf2. However, a relationship in time period between the sub-frame periods Psf of the frame period Pf is not limited to the above example, but can be variously modified. For example, the sub-frame periods Psf of the frame period Pf may have the same time period as each other.

In the sub-frame period Psf1 of the frame period Pf, the select signal SE is a low (L) level. The select circuit 53 selects the second reference voltage V2 to generate the gradation voltages VG2 of the second system. The gate driver GD sequentially supplies control signals SG to the gate lines SSG, and the source driver SD selects the gradation voltage corresponding to the gradation value of the image data ID from the gradation voltages VG2 of the second system and supplies the selected gradation voltage to the source line VL.

The gradation voltage VG2 is written from the source line VL to the gate electrode GE via the pixel switch SST, and the gradation voltage VG2 is stored in the storage capacitor Cs. The amount of the current flowing to the drive transistor DRT is thereby regulated. The light emitting element 30 emits light (illuminates) by making the current I flow to the light emitting element 30 in accordance with the current value determined based on the gradation voltage VG2. In other words, the current I corresponding to the electric potential of the gate electrode GE of the drive transistor DRT, which is written by the above write operation, passes through the drive transistor DRT, and flows to the light emitting element 30, and the light emitting element 30 thereby emits light.

The luminance level of the display image in the sub-frame period Psf1 can be lowered by supplying the gradation voltage VG2 to the pixel SP, as compared with a case of supplying the gradation voltage VG1. For example, the contrast ratio can be made higher.

A part of the sub-frame period Psf1 does not need to be replaced with a black display period. For this reason, the situation where the aperture ratio of the pixel SP becomes low can be avoided as compared with the case of supplying the gradation voltage VG1 to the pixel SP and replacing a part of the sub-frame period Psf1 with the black display period. Furthermore, addition of the drive to replace the black display period can be avoided. Based on the above descriptions, this embodiment can contribute to improvement of the display quality.

In the sub-frame period Psf2 following the sub-frame period Psf1, the select signal SE switches to a high (H) level. The select circuit 53 selects the first reference voltage V1 to generate the gradation voltages VG1 of the first system. The gate driver GD sequentially supplies control signals SG to the gate lines SSG, and the source driver SD selects the gradation voltage corresponding to the gradation value of the image data ID from the gradation voltages VG1 of the first system and supplies the selected gradation voltage to the source line VL. In this case, the current I corresponding to the gradation voltage VG1 flows to the light emitting element 30 and the light emitting element 30 thereby emits light.

In the sub-frame period Psf3 following the sub-frame period Psf2, the select signal SE is maintained at the H level. The select circuit 53 selects the second reference voltage V2 to generate the gradation voltages VG2 of the second system. The gate driver GD sequentially supplies control signals SG to the gate lines SSG, and the source driver SD selects the gradation voltage corresponding to the gradation value of the image data ID from the gradation voltages VG1 of the first system and supplies the selected gradation voltage to the source line VL.

The display operation of the display device 1 is executed as described above.

The period in which the gradation voltage VG2 of the second system is used may not be the sub-frame period Psf1, but the sub-frame period Psf2 or the sub-frame period Psf3. That is, the period in which the gradation voltage VG2 of the second system is used may be any one of the sub-frame periods Psf1, Psf2, and Psf3. Alternatively, the period in which the gradation voltage VG2 of the second system is used may be any two sub-frame periods of the sub-frame periods Psf1, Psf2, and Psf3.

In relation to the period in which the gradation voltage VG1 of the first system is used and the period in which the gradation voltage VG2 of the second system is used, the operation of one frame may be executed as follows.

In each of one or more sub-frame periods Psf of the frame period Pf, the gate driver GD supplies the control signals SG to the gate lines SSG, and the source driver SD selects the gradation voltage corresponding to the gradation value of the image data ID from the gradation voltages VG1 of the first system and supplies the selected gradation voltage to the corresponding source line VL.

In each of the remaining sub-frame periods Psf, i.e., at least one sub-frame period, of the frame period Pf, the gate driver GD supplies the control signals SG to the gate lines SSG, and the source driver SD selects the gradation voltage corresponding to the gradation value of the image data ID from the gradation voltages VG2 of the second system and supplies the selected gradation voltage to the corresponding source line VL.

According to the display device 1 of the first embodiment configured as described above, the pixel SP can be driven by using the gradation voltage VG2 different from the gradation voltage VG1 in a desired sub-frame period Psf of the frame period Pf. A sub-frame period Psf having a relatively low luminance level can be provided in the frame period Pf by making the voltage level of the gradation voltage VG2 relatively lower than that of the gradation voltage VG1. For this reason, even a low-gradation image can be desirably displayed.

Based on the above descriptions, the display device excellent in the display quality can be obtained.

Second Embodiment

Figure 8:
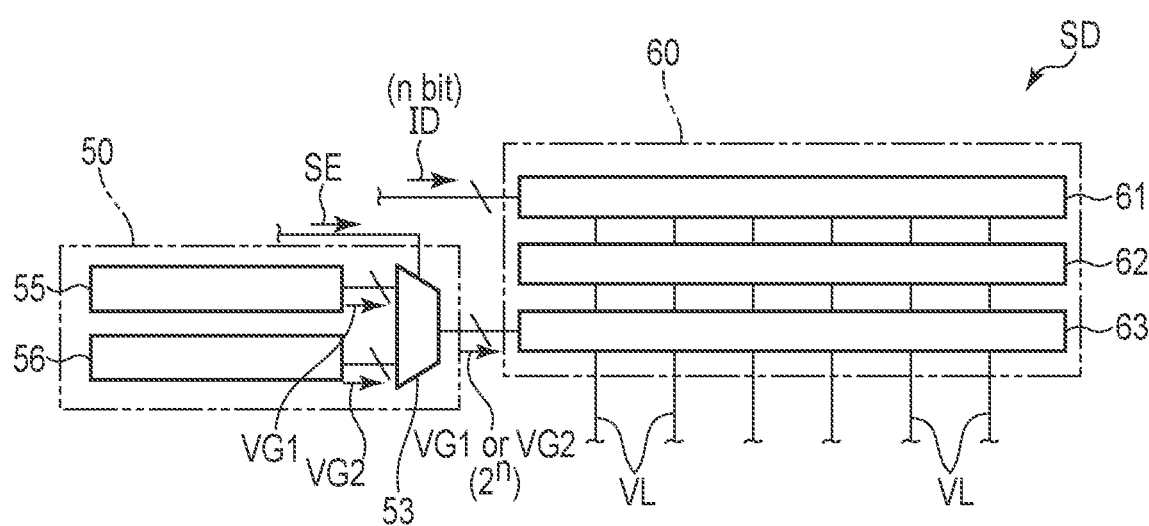
FIG. 8 is a circuit diagram showing a configuration of a source driver of a display device according to a second embodiment.

Next, a second embodiment will be described, and FIG. 8 is a circuit diagram showing a configuration of a source driver SD of a display device 1 according to the second embodiment. The display device 1 of the second embodiment is different from the first embodiment in the configuration of the source driver SD (control circuit 50).

As shown in FIG. 8, the source driver SD comprises a control circuit 50 and a driving circuit 60. The control circuit 50 includes a first gradation voltage generation circuit 55, a second gradation voltage generation circuit 56, and a select circuit 53.

Each of the first gradation voltage generation circuit 55 and the second gradation voltage generation circuit 56 is composed of a voltage divider in which a plurality of resistors are connected in series. The first gradation voltage generation circuit 55 is configured to generate and output a plurality of gradation voltages VG1 of a first system. The second gradation voltage generation circuit 56 is configured to generate and output a plurality of gradation voltages VG2 of a second system.

The select circuit 53 is composed of a multiplexer. The gradation voltages VG1 of the first system is input from the first gradation voltage generation circuit 55, the gradation voltages VG2 of the second system is input from the second gradation voltage generation circuit 56, and a select signal SE is further input, to the select circuit 53. The select circuit 53 is configured to output the gradation voltages VG1 of the first system or the gradation voltages VG2 of the second system, based on the select signal SE.

In the display device 1 of the second embodiment configured as described above, too, the same advantages as those of the first embodiment can be obtained. The first gradation voltage generation circuit 55 that generates the gradation voltage VG1 and the second gradation voltage generation circuit 56 that generates the gradation voltage VG2 are physically independent. The gradation voltage VG1 and the gradation voltage VG2 can be input to the select circuit 53. For this reason, highly accurate voltage values of the gradation voltages VG1 and VG2 can be obtained as compared with the above-described first embodiment.

Based on the above descriptions, the display device 1 excellent in the display quality can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, as described above, in at least a gradation region of all the gradation regions of the image data ID, the value of the corresponding gradation voltage VG2 of the second system may be relatively different from the value of the corresponding gradation voltage VG1 of the first system, at each of the same gradation.

For example, in at least a low gradation region of all the gradation regions of the image data ID, the value of the corresponding gradation voltage VG2 of the second system may be relatively lower than the value of the corresponding gradation voltage VG1 of the first system, at each of the same gradation.

The lower 3-bit image data ID may be mentioned as the low gradation region of the image data ID. When n=8, the value of the corresponding gradation voltage VG2 of the second system may be the same as the value of the corresponding gradation voltage VG1 of the first system, for each of the same gradation values, in the upper 5-bit image data ID.

In the above embodiments, the micro LED display device using the micro LED as the light emitting element has been mainly described. However, the above embodiments may be applied to the other display devices such as an organic EL display device using the organic electroluminescent (EL) element as the light emitting element.

What is claimed is:

1. A display device comprising:
a plurality of pixels arranged in a row direction and a columnar direction;
a plurality of gate lines, each of the gate lines being shared by the plurality of pixels arranged in the row direction;
a plurality of source lines, each of the source lines being shared by the plurality of pixels arranged in the columnar direction;
a first driver supplying control signals to the plurality of gate lines; and
a second driver selecting a gradation voltage corresponding to a gradation value of input image data from either of a plurality of gradation voltages of a first system and gradation voltages of a second system, and supplying the selected gradation voltage to the corresponding source line of the plurality of source lines,
in at least a gradation region of all gradation regions of the image data, a value of the corresponding gradation voltage of the second system being relatively different from a value of the corresponding gradation voltage of the first system, for each of same gradation values.

2. The display device of claim 1, further comprising:
a first power line; and
a second power line,
wherein
each of the pixels includes:
a drive transistor and a light emitting element connected in series between the first power line and the second power line;
a pixel switch connected between the corresponding source line of the plurality of source lines and a gate electrode of the drive transistor, and switched to an on state or an off state by the control signal supplied via the corresponding gate line of the plurality of gate lines; and
a storage capacitor connected to the gate electrode.

3. The display device of claim 2, wherein
the light emitting element is a micro light emitting diode.

4. The display device of claim 3, wherein
in at least a low gradation region of all the gradation regions of the image data, a value of the corresponding gradation voltage of the second system is relatively lower than a value of the corresponding gradation voltage of the first system, for each of the same gradation values.

5. The display device of claim 2, wherein
in at least a low gradation region of all the gradation regions of the image data, a value of the corresponding gradation voltage of the second system is relatively lower than a value of the corresponding gradation voltage of the first system, for each of the same gradation values.

6. The display device of claim 1, wherein
in at least a low gradation region of all the gradation regions of the image data, a value of the corresponding gradation voltage of the second system is relatively lower than a value of the corresponding gradation voltage of the first system, for each of the same gradation values.

7. The display device of claim 1, wherein
one frame period includes a plurality of sub-frame periods,
in each of one or more sub-frame periods of the frame period, the first driver supplies the control signals to the plurality of gate lines, and the second driver selects the gradation voltage corresponding to the gradation value of the image data from the plurality of gradation voltages of the first system and supplies the selected gradation voltage to the corresponding source line, and
in each of at least one sub-frame period that is a remaining sub-frame period of the frame period, the first driver supplies the control signals to the plurality of gate lines, and the second driver selects the gradation voltage corresponding to the gradation value of the image data from the plurality of gradation voltages of the second system and supplies the selected gradation voltage to the corresponding source line.

8. The display device of claim 7, wherein
the plurality of sub-frame periods of the frame period have any time period of two or more time periods.

9. The display device of claim 1, wherein
the second driver includes:
  a control circuit outputting the plurality of gradation voltages of the first system or the plurality of gradation voltages of the second system; and
  a drive circuit to which the image data is input, to which the plurality of gradation voltages of the first system or the second system are further input from the control circuit, and which selects the gradation voltage corresponding to the gradation value of the image data from the plurality of gradation voltages of the input system and supplies the selected gradation voltage to the corresponding source line.

10. The display device of claim 9, wherein
the control circuit includes:
  a first gradation power supply outputting a first reference voltage;
  a second gradation power supply outputting a second reference voltage different from the first reference voltage;
  a select circuit to which the first reference voltage, the second reference voltage, and a select signal are input, and which outputs the first reference voltage or the second reference voltage, based on the select signal; and
  a gradation voltage generation circuit which generates the plurality of gradation voltages of the first system, based on the first reference voltage input from the select circuit or generates the plurality of gradation voltages of the second system, based on the second reference voltage input from the select circuit.

11. The display device of claim 9, wherein
the control circuit includes:
  a first gradation voltage generation circuit generating the plurality of gradation voltages of the first system;
  a second gradation voltage generation circuit generating the plurality of gradation voltages of the second system; and
  a select circuit to which the plurality of gradation voltages of the first system, the plurality of gradation voltages of the second system, and a select signal are input, and which outputs the plurality of gradation voltages of the first system or the second system, based on the select signal.

12. The display device of claim 1, wherein
the image data is an n-bit digital signal,
a plurality of gradation voltages of each of the first system and the second system are analog signals of $2^n$ gradation, and
the n is a natural number.

* * * * *